(12) United States Patent
Ayranci et al.

(10) Patent No.: US 12,506,447 B2
(45) Date of Patent: Dec. 23, 2025

(54) TUNABLE HYBRID WIDEBAND LNA ARCHITECTURE

(71) Applicant: Murata Manufacturing Co., Ltd., Kyoto (JP)

(72) Inventors: Emre Ayranci, Costa Mesa, CA (US); Jubaid Qayyum, San Diego, CA (US); Phanindra Yerramilli, San Diego, CA (US); Miles Sanner, San Diego, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 653 days.

(21) Appl. No.: 17/855,418

(22) Filed: Jun. 30, 2022

(65) Prior Publication Data
US 2024/0007059 A1   Jan. 4, 2024

(51) Int. Cl.
*H03F 3/195*   (2006.01)
*H03F 1/56*    (2006.01)

(52) U.S. Cl.
CPC ............. *H03F 1/565* (2013.01); *H03F 3/195* (2013.01); *H03F 2200/222* (2013.01); *H03F 2200/294* (2013.01); *H03F 2200/387* (2013.01); *H03F 2200/451* (2013.01)

(58) Field of Classification Search
CPC . H03F 1/565; H03F 1/223; H03F 1/42; H03F 3/195; H03F 3/193; H03F 2200/222; H03F 2200/294; H03F 2200/387
USPC ................................. 330/297, 302, 277, 311
See application file for complete search history.

(56) References Cited

U.S. PATENT DOCUMENTS

| | | |
|---|---|---|
| 10,951,252 B2 * | 3/2021 | Ayranci ............... H03G 1/0088 |
| 2010/0308933 A1 | 12/2010 | See et al. |
| 2012/0243580 A1 | 9/2012 | Wright |
| 2015/0091649 A1 | 4/2015 | Jeon et al. |

(Continued)

OTHER PUBLICATIONS

Zulkepli et al. "Asymmetric T-coil, Resistive Feedback Cascode Low Noise Amplifier for Ultrawideband Receiver" 2015 IEEE International Circuits and Systems Symposium (ICSyS) (Year: 2015).*

(Continued)

*Primary Examiner* — Andrea Lindgren Baltzell
*Assistant Examiner* — Nareh Shamiryan
(74) *Attorney, Agent, or Firm* — Steinfl + Bruno LLP

(57) ABSTRACT

Circuits and methods for an LNA that enable selection of a first mode providing high gain with wide output impedance matching, and a second mode providing wideband output impedance matching with improved NF and linearity at moderate gain. Some embodiments allow multiple intermediate modes to enable selection of gain versus linearity and NF. One embodiment includes a matching network having an input terminal configured to be coupled to an amplified-signal terminal of an amplification core, and an output terminal, the matching network including a first inductor coupled between the input terminal and a first node; a second inductor coupled to the first node; a boosted amplification branch coupled between the input terminal and the output terminal; and a non-amplification branch coupled between the first node and the output terminal; wherein the boosted amplification branch is enabled in a first mode, and the non-amplification branch is enabled in a second mode.

19 Claims, 10 Drawing Sheets

(56) References Cited

U.S. PATENT DOCUMENTS

2021/0067103 A1\* 3/2021 Wakaki ................... H03F 3/19
2021/0143779 A1  5/2021 Ayranci et al.
2021/0409055 A1 12/2021 Ayranci et al.
2022/0247364 A1\* 8/2022 Padyana ................ H03F 1/223

OTHER PUBLICATIONS

Lee, Kang Ha, International Search Report and Written Opinion received from the KIPO dated Oct. 4, 2023 for appln. No. PCT/US2023/025218, 10 pgs.

Ayranci, et al. "Wideband Multi-Gain LNA Architecture", patent application filed Jun. 2, 2021, U.S. Appl. No. 17/337,227, 46 pgs.

\* cited by examiner

TUNABLE HYBRID WIDEBAND LNA ARCHITECTURE

BACKGROUND

(1) Technical Field

The invention relates to electronic circuits, and more particularly to radio frequency amplifier circuits.

(2) Background

Many modern electronic systems include radio frequency (RF) receivers; examples include cellular telephones, personal computers, tablet computers, wireless network components, televisions, cable system "set top" boxes, and radar systems. Many RF receivers are paired with RF transmitters in the form of transceivers, which often are quite complex two-way radios. In some cases, RF transceivers are capable of transmitting and receiving across multiple frequencies in multiple bands.

Amplifiers are a common component in RF transmitters, receivers, and transceivers, and are frequently used for power amplification of transmitted RF signals and for low-noise amplification of received RF signals. For many RF systems, particularly those requiring low power and/or portability (e.g., cellular telephones, WiFi-connected computers, cameras, and other devices), it has become common to use complementary metal-oxide semiconductor (CMOS) fabrication technology to create low cost, low power integrated circuits (ICs). CMOS devices include bulk CMOS, silicon-on-insulator (SOI) CMOS, and silicon-on-sapphire (SOS) CMOS (SOS being a type of SOI fabrication technology).

Receiving an RF signal in many environments requires a high quality low-noise amplifier (LNA) as part of an RF "front end" (RFFE) receiver or transceiver chain of circuits. Important desired characteristics of an LNA are high gain with low noise, a wide bandwidth, good linearity, and good input and output impedance matching. However, in general, all of these factors cannot be optimized simultaneously, and accordingly there are tradeoffs between these characteristics when designing an LNA.

Five important design parameters for LNAs are gain, noise figure (NF), input-referenced third intercept point (IIP3), output reflection coefficient, and input reflection coefficient. NF is a measure of degradation of the signal-to-noise ratio (SNR) caused by components in a signal chain, with lower values indicating better performance. IIP3 is a figure of merit representing amplifier linearity, with higher values indicating better performance. In general, NF has a stricter specification requirement in high-gain modes than in low gain-modes, while IIP3 has a stricter specification requirement in low-gain modes than in high-gain modes. The output reflection coefficient is the $S_{22}$ scattering parameter (or "S-parameter") and is an indication of output impedance matching, with lower (more negative, when evaluated logarithmically) numbers indicating better impedance matching (lower output loss). The input reflection coefficient is the $S_{11}$ S-parameter and is an indication of how much power is reflected back to the antenna, with lower (more negative, when evaluated logarithmically) numbers indicating better performance (lower input loss).

Increases in the frequency of RF communications bands and channels, as well as a continuing increase in the number of bands and channels in use, has pushed current LNA architectures to their limits. For example, achieving stringent requirements for gain, percentage bandwidth, linearity, and output impedance matching with a traditional LNA architecture is difficult, and sometimes impossible, for some of the new 5G mobile network bands, particularly in the 3 to 6 GHz NR bands, the upcoming 7-24 GHz bands, and the millimeter wave range (e.g., 24.25 GHz to 52.6 GHz).

Accordingly, there is a need for an LNA architecture that overcomes the limitations of conventional LNA architectures.

SUMMARY

The present invention encompasses circuits and methods for an LNA that enable selection of a first mode of operation providing high gain with wide output impedance matching with trade-offs with respect to current, NF, and linearity, and a second mode of operation providing wideband output impedance matching with improved NF and linearity at lower current and moderate gain. Some embodiments allow multiple intermediate modes of operation to allow selection of gain versus linearity and NF characteristics. The inventive circuits and methods may also be applied to other types of amplifiers, such as power amplifiers.

One embodiment of the invention includes a tunable hybrid wideband output impedance matching network having an input terminal configured to be coupled to an amplified-signal terminal of an amplification core, and an output terminal configured to be coupled to a radio-frequency (RF) output terminal, the tunable hybrid wideband output impedance matching network including: a first inductor coupled between the input terminal and a first node; a second inductor coupled to the first node and configured to be coupled to a power supply; a boosted amplification branch coupled between the input terminal and the output terminal; and a non-amplification branch coupled between the first node and the output terminal; wherein the boosted amplification branch is enabled in a first mode of operation, and the non-amplification branch is enabled in a second mode of operation.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses circuits and methods for an LNA that enable selection of a first mode of operation providing high gain with wide output impedance matching with trade-offs with respect to current, NF, and linearity, and a second mode of operation providing wideband output impedance matching with improved NF and linearity at lower current and moderate gain. Some embodiments allow multiple intermediate modes of operation to allow selection of gain versus linearity and NF characteristics. The inventive circuits and methods may also be applied to other types of amplifiers, such as power amplifiers.

Bandwidth Terms

For purposes of this disclosure, "narrowband", "wideband" and "ultra-wideband" may be characterized as a percentage bandwidth equal to (stop frequency $f_{STOP}$ minus start frequency $f_{START}$) divided by the center frequency $f_{CENTER}$ of a band, or $(f_{STOP}-f_{START})/f_{CENTER}$ (expressed as a percentage), where $f_{CENTER}=(f_{STOP}+f_{START})/2$. TABLE 1 below shows typical guidelines (not strict definitions) for characterizing typical percentage bandwidths.

TABLE 1

| Nominal Band Name | % bandwidth range |
| --- | --- |
| Narrowband | <7.5% |
| Extended Narrowband | 7.5%~15% |
| Wideband | 15%~25% |
| Ultra-wideband | >25% |

TABLE 2 below provides examples of common cellular telephone bands and their characterization as wideband or ultra-wideband using the guidelines in TABLE 1.

TABLE 2

| Typical Application | $f_{START}$ (GHz) | $f_{STOP}$ (GHz) | $f_{CENTER}$ (GHz) | % Bandwidth |
| --- | --- | --- | --- | --- |
| Wideband (N77) | 3.3 | 4.2 | 3.75 | 24.00% |
| Ultra-Wideband (NR-U) | 5.125 | 7.125 | 6.125 | 32.65% |
| Ultra-Wideband (UWB) | 6.2 | 9 | 7.6 | 36.84% |

First Embodiment

Figure 1A:
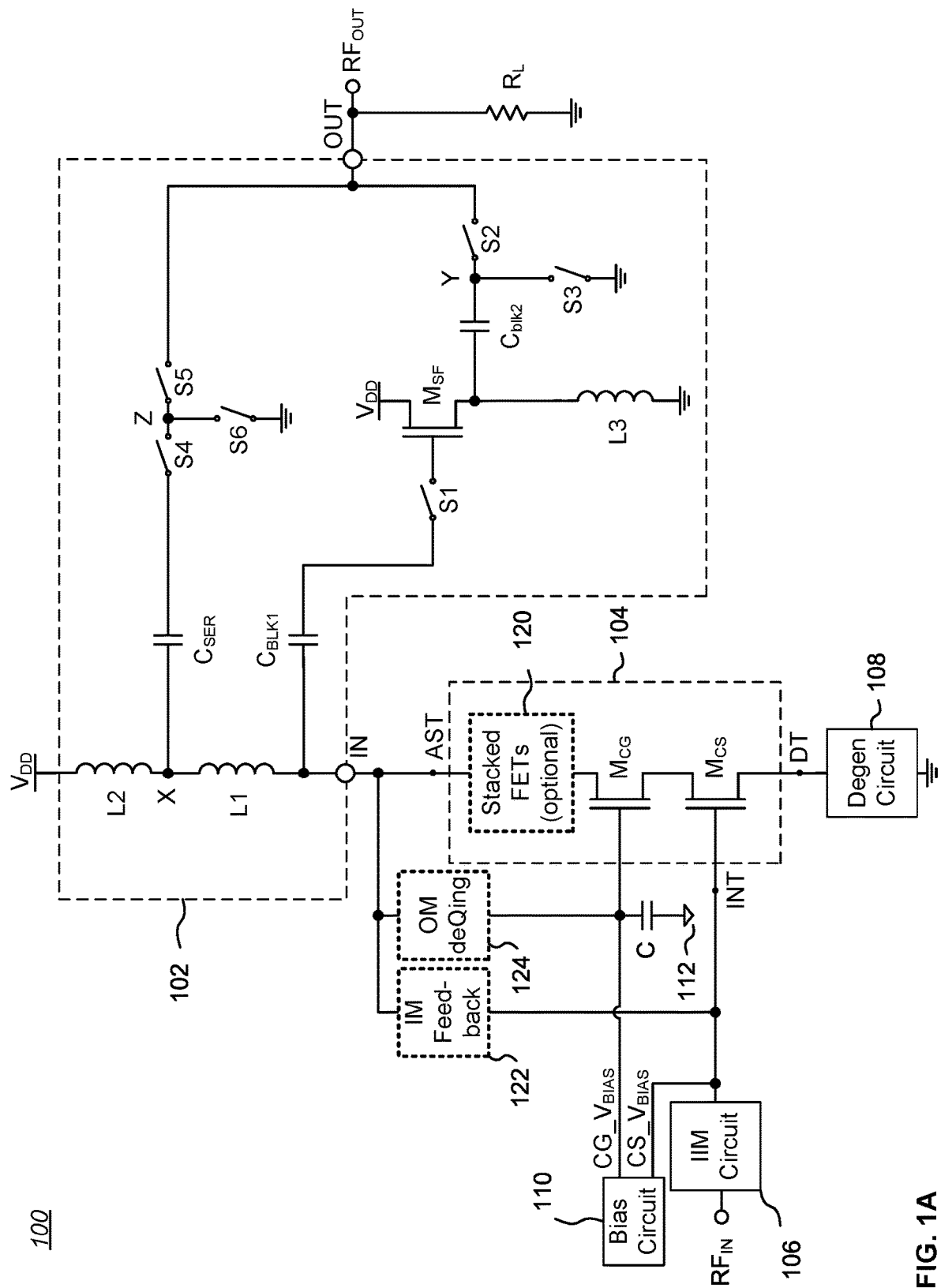
FIG. 1A is a simplified schematic diagram of a first embodiment of a low-noise amplifier circuit having a tunable hybrid wideband output impedance matching network.

FIG. 1A is a simplified schematic diagram of a first embodiment of a low-noise amplifier circuit 100 having a tunable hybrid wideband output impedance matching network 102. In the illustrated example, the LNA circuit 100 includes an amplifier core 104 comprising a stack of two series-connected FETs $M_{CS}$, $M_{CG}$ in a cascode arrangement. An RF input signal applied to an RF input terminal $RF_{IN}$ may be passed through an input impedance matching (IIM) circuit 106 and coupled to the control gate of the common-source FET $M_{CS}$, which may be regarded as an input terminal INT of the amplification core 104.

The source of the common-source FET $M_{CS}$ is typically connected through a degeneration circuit 108 to a reference potential, such as circuit ground. Accordingly, the source of the common-source FET $M_{CS}$ may be regarded as a degeneration terminal DT of the amplification core 104.

The source of the common-gate FET $M_{CG}$ is connected to the drain of the common-source FET $M_{CS}$. The drain of the common-gate FET $M_{CG}$ provides an amplified RF output signal at what may be regarded as an amplified-signal terminal AST of the amplification core 104.

A bias circuit 110 is configured to provide a suitable bias voltage $CG\_V_{BIAS}$ to the common-gate FET $M_{CG}$ and a suitable bias voltage $CS\_V_{BIAS}$ to the common-source FET $M_{CS}$, in known fashion. Of note, one or both of the bias voltages $CG\_V_{BIAS}$ and $CS\_V_{BIAS}$ may be zero volts in some applications (i.e., no added voltage), and in some applications the $CG\_V_{BIAS}$ may be a reference voltage, such as an AC ground. Additional well-known circuit elements that might be included in some applications, such as DC blocking capacitors, are omitted for clarity.

The tunable hybrid wideband output impedance matching network ("THWOIM network") 102 has an IN terminal configured to be coupled to the amplified-signal terminal AST of the amplification core 104, and an OUT terminal configured to be coupled to an RF output terminal $RF_{OUT}$. The amplified output of the amplification core 104 is coupled through the THWOIM network 102 to the RF output terminal $RF_{OUT}$, which is shown coupled to a typical load represented as a resistor $R_L$. The value of $R_L$ is typically 50 ohms for many modern RF circuits.

The THWOIM network 102 includes a first inductor L1 coupled in series with a second inductor L2 at a node X, with the pair of inductors L1, L2 coupled to the IN terminal and configured to be coupled to a power supply $V_{DD}$. The THWOIM network 102 in the illustrated example includes two branches.

A first branch includes a first DC blocking capacitor $C_{BLK1}$ coupled between the amplified-signal terminal AST of the amplification core 104 and a first terminal of a switch S1. A second terminal of the switch S1 is coupled to the control gate of a second-stage FET $M_{SF}$, which provides a second stage of amplification as a voltage-buffer source-follower circuit. In the illustrated example, the second-stage FET $M_{SF}$ has a conduction channel (drain to source) coupled between $V_{DD}$ and a third inductor L3, which in turn is coupled to a reference potential, such as circuit ground. The source of the second-stage FET $M_{SF}$ is coupled through a second DC blocking capacitor $C_{BLK2}$ to a node Y. A switch S2 is coupled between node Y and the OUT terminal. A shunt switch S3 is coupled between a reference potential, such as circuit ground, and node Y. The switches S1-S3 may be implemented (by way of example only) as FETs, particularly MOSFETS.

A second branch includes a third capacitor $C_{SER}$ coupled between node X and a switch S4. The third capacitor $C_{SER}$ may be utilized as part of the output matching network. A switch S5 is coupled between switch S4 and the OUT terminal. A shunt switch S6 is coupled between a reference potential, such as circuit ground, and a node Z between switches S4 and S5. The switches S4-S6 may be implemented (by way of example only) as FETs, particularly MOSFETS.

To enable the first mode of operation, which may be called a high-gain or gain-boost mode, the first branch is set to an active state in which switches S1, S2, and S6 are set to a CLOSED state and switches S3, S4, and S5 are set to an OPEN state. The combination of inductors L1 and L2 functions as the load for the inductively degenerated first stage (i.e., the amplification core 104) of the overall LNA 100. Closing shunt switch S6 provides a path to ground to avoid loading the $RF_{OUT}$ output due to the first stage tapped load (i.e., L1+L2 tapped at node X). The AC component of the amplified signal from the amplified-signal terminal AST is further amplified by the second-stage FET $M_{SF}$, with the AC component of that amplified signal being provided at the $RF_{OUT}$ terminal. Accordingly, the first branch may be selectively enabled as a boosted amplification branch.

The first mode of operation offers high gain owing to the two stages of amplification with wide output impedance matching. The trade-offs for such high gain are higher DC current, NF, and linearity compared to the second mode of operation.

To enable the second mode of operation, which may be called a high-performance moderate-gain mode, the second branch is set to an active state in which switches S3, S4, and S5 are set to a CLOSED state and switches S1, S2, and S6 are set to an OPEN state. Closing shunt switch S3 provides a path to ground to avoid loading the $RF_{OUT}$ output due to the source-follower second stage FET $M_{SF}$ of the first (high-gain) branch. In this mode, inductor L1 is located between the drain of the common-gate FET $M_{CG}$ cascode device and capacitor $C_{SER}$, and the AC component of the amplified signal from the amplified-signal terminal AST is coupled to the $RF_{OUT}$ terminal without further amplification. Accordingly, the second branch may be selectively enabled as a non-amplification branch.

The inductive load L2 extends the output bandwidth of the LNA 100 as well as providing higher gain compared to a traditional single-stage cascode LNA due to the increased impedance at the drain of the common-gate FET $M_{CG}$ cascode device.

Inductors L1 and L2 would typically be tuned such that they can provide a wide output impedance matching in both modes of operation while ensuring that their summation still provides a flat gain response for the high-gain mode of operation. For the high-performance mode, additional tuning can be achieved using capacitor $C_{SER}$.

Optional Circuit Elements

A. Stack of FETS. In some embodiments, in order to overcome a relatively low break-down voltage per CMOS FET, multiple common-gate FETS may be series-coupled in a FET stack 120 between the drain of the bottom-most common-gate FET $M_{CG}$ and the amplified-signal terminal AST as shown in FIG. 1A—that is, the amplification core 104 may have multiple series-coupled common-gate FETs in a cascode configuration. The amplified-signal terminal AST would then be at the drain of the upper-most common-gate FET in the amplification core 104.

Figure 1B:
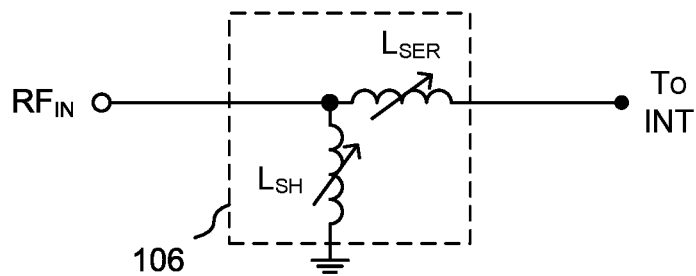
FIG. 1B is a schematic diagram of one embodiment of an enhanced IIM circuit.

B. Enhanced Input Impedance Matching Circuit. While a number of circuits may be used for the IIM circuit 106 in the embodiment of FIG. 1A, it may be useful to utilize an enhanced input impedance matching circuit. For example, FIG. 1B is a schematic diagram of one embodiment of an enhanced IIM circuit 106. The enhanced IIM circuit 106 includes a series inductor $L_{SER}$ coupled between the $RF_{IN}$ terminal and the input terminal INT of the amplification core 104, and a shunt inductor $L_{SH}$ coupled between $L_{SER}$ and a reference potential (e.g., circuit ground). In alternative embodiments, $L_{SH}$ may be connected to $L_{SER}$ on the INT terminal side of the $L_{SER}$ rather than on the $RF_{IN}$ terminal side (noting that if the order of connections changes, there may be different input impedance matching bandwidth and noise figure tradeoffs). Either or both of $L_{SER}$ and $L_{SH}$ may be adjustable components, as shown, or have fixed values. In embodiments that include a degeneration circuit 108, the series-shunt inductors $L_{SER}$, $L_{SH}$ of the enhanced IIM circuit 106, together with the common source FET $M_{CS}$ coupled to the degeneration circuit 108, form a doubly-terminated bandpass filter which increases the input bandwidth of an LNA circuit 100.

C. Input Matching Feedback Circuit. Some embodiments may include an input matching (IM) feedback circuit 122. The IM feedback circuit 122 is shown in FIG. 1A as coupled between the input terminal INT and the amplified-signal terminal AST. More generally, the IM feedback circuit 122 may be coupled to a feedback node in the output signal path of the amplification core 104, which may be the drain of any of the FETS in the amplification core 104. The choice of feedback node for connection to the IM feedback circuit 122 may be made, for example, based on different desired feedback strength and different desired input impedance.

Figure 1C:
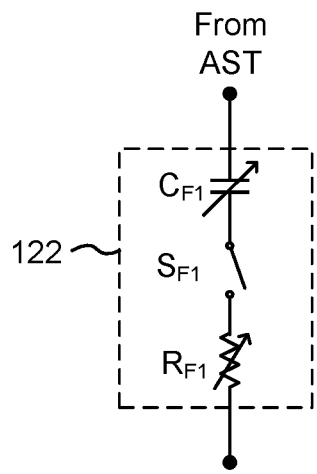
FIG. 1C is a schematic diagram of one embodiment of an input matching feedback circuit.

FIG. 1C is a schematic diagram of one embodiment of an input matching feedback circuit 122. The IM feedback circuit 122 in the illustrated example comprises a DC blocking capacitor $C_{F1}$ series-coupled with a switch $S_{F1}$, which in turn is series-coupled to a resistor $R_{F1}$. In some embodiments, $C_{F1}$ and/or $R_{F1}$ may be adjustable, as shown, or have fixed values. In alternative embodiments, the IM feedback circuit 122 may include one or more parallel switches $S_{F11}$ ... $S_{F1n}$ (generically, $S_{F1x}$), which in turn are series-coupled to respective parallel resistor(s) $R_{F11}$ ... $R_{F1n}$ (generically, $R_{F1x}$). With n parallel switch/resistor branches, the tunability of the resistors $R_{F1x}$ is equal to $2^n$ (the total number of switching combinations). Note that the values of the resistors $R_{F1x}$ need not be identical. The IM feedback circuit 122 may be disabled by opening all feedback switches $S_{F1x}$.

In alternative embodiments, capacitor $C_{F1}$, the set of one or more switches $S_{F1x}$, and the set of one or more resistors $R_{F1x}$ may be connected in any series order. In still other embodiments, the switches $S_{F1x}$ may be omitted, thereby permanently coupling the set of one or more resistors $R_{F1x}$ between the input terminal INT and a feedback node in the output signal path of the amplification core 104.

In various gain modes, the in-circuit presence of one or more resistors $R_{F1x}$ allows the Q-factor of the input impedance matching to be reduced, which increases the bandwidth of the enhanced LNA circuit 100 at the expense of gain and NF.

An advantage of using a variable or multi-state IM feedback circuit 122 is that multiple resistance values enable multiple gain modes. For instance, LNAs in mobile RF receiver devices may need multiple gain modes depending upon the range of input signal strength at the receiver. In addition, enabling multiple gain modes by using variable or multi-state feedback resistors $R_{F1x}$ may eliminate the need for an output attenuator (common in conventional receiver LNAs).

Further information regarding the IM feedback circuit 122 may be found in U.S. patent application Ser. No. 17/337,227, filed Jun. 2, 2021, entitled "*Wideband Multi Gain LNA Architecture*", assigned to the assignee of the present invention, the contents of which are hereby incorporated by reference.

D. Output Matching deQing Circuit. Some embodiments may include an output matching (OM) deQing circuit 124. The OM deQing circuit 124 is shown in FIG. 1A as coupled between the amplified-signal terminal AST and the control gate of the common-gate FET $M_{CG}$, which in turn is connected to AC ground 112 through a blocking capacitor C. The OM deQing circuit 124 functions to lower the transformation Q of the THWOIM network 102. Lowering the transformation Q extends the output impedance matching bandwidth of the LNA circuit 100. This architecture shows a better gain and bandwidth tradeoff in a wide variety of applications compared to other known circuits.

Figure 1D:
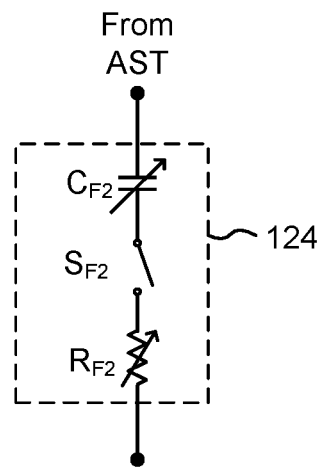
FIG. 1D is a simplified schematic diagram of one embodiment of an output matching deQing circuit.

FIG. 1D is a simplified schematic diagram of one embodiment of an output matching deQing circuit 124. The OM deQing circuit 124 in the illustrated example comprises a DC blocking capacitor $C_{F2}$ series-coupled with a switch $S_{F2}$, which in turn is series-coupled to a resistor $R_{F2}$. In some embodiments, $C_{F2}$ and/or $R_{F2}$ may be adjustable, as shown, or have fixed values. In alternative embodiments, the OM deQing circuit 124 may include one or more parallel switches $S_{F21} \ldots S_{F2n}$ (generically, $S_{F2x}$), which in turn are series-coupled to respective parallel resistor(s) $R_{F21} \ldots R_{F2n}$ (generically, $R_{F2x}$). With n parallel switch/resistor branches, the tunability of the resistors $R_{F2x}$ is equal to $2^n$ (the total number of switching combinations). Note that the values of the resistors $R_{F2x}$ need not be identical. The OM deQing circuit 124 may be disabled by opening all feedback switches $S_{F2x}$.

In alternative embodiments, capacitor $C_{F2}$, the set of one or more switches $S_{F2x}$, and the set of one or more resistors $R_{F2x}$ may be connected in any series order. In still other embodiments, the switches $S_{F2x}$ may be omitted, thereby permanently coupling the set of one or more resistors $R_{F2x}$ between the amplified-signal terminal AST and the control gate of the common-gate FET $M_{CG}$.

In various gain modes, the in-circuit presence of one or more resistors $R_{F2x}$ allows the Q-factor of the output impedance matching to be reduced, which increases the bandwidth of the enhanced LNA circuit 100 at the expense of gain and NF. For example, switching a single resistor $R_{F2}$ in-circuit or out-of-circuit provides two operation modes, a first mode having a wider output impedance matching bandwidth, and a second mode having a narrower output impedance matching bandwidth but with higher gain than the first mode. As noted above, making $R_{F2}$ variable or enabling more than one resistor value enables additional modes of operation.

More specifically, when switch $S_{F2}$ is CLOSED, $R_{F2}$ couples the amplified-signal terminal AST to the control gate of the common-gate FET $M_{CG}$, effectively placing $R_{F2}$ in parallel with the equivalent resistance $R_D$ of the amplifier core 104 circuit. The in-circuit presence of $R_{F2}$ lowers the impedance, $Z_{DRAIN}$, of the amplifier core 104 as seen at the AST terminal, and reduces the transformation Q of the THWOIM network 102, where Q is approximately equal to the real part of $Z_{DRAIN}$ divided by the load resistance $R_L$, or $Re(Z_{DRAIN}/R_L)$. Accordingly, the transformation Q is lowered, thereby extending the output impedance matching bandwidth of the LNA circuit 100. This architecture shows a better gain and bandwidth tradeoff in a wide variety of applications compared to other known circuits.

Conversely, when switch $S_{F2}$ is OPEN, $R_{F2}$ is out-of-circuit with respect to $R_D$ in the equivalent circuit, and the transformation Q the THWOIM network 102 is not reduced.

An advantage of using a variable or multi-state OM deQing circuit 124 is that multiple resistance values enable multiple gain modes. For instance, LNAs in mobile RF receiver devices may need multiple gain modes depending upon the range of input signal strength at the receiver. In addition, enabling multiple gain modes by using variable or multi-state deQing resistors $R_{F2x}$ may eliminate the need for an output attenuator (common in conventional receiver LNAs).

Figure 1E:
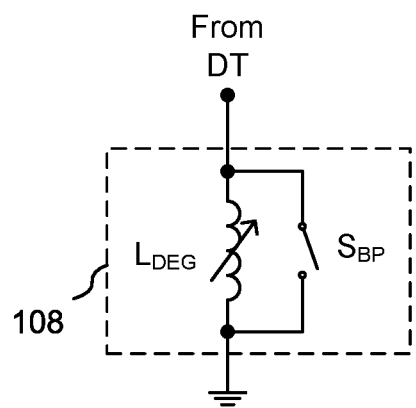
FIG. 1E is a schematic diagram of one embodiment of a selectable degeneration circuit.

E. Degeneration Circuit. The degeneration circuit 108 shown in FIG. 1A may simply comprise a fixed inductor. However, for greater flexibility, additional elements may be included within the degeneration circuit 108. For example, FIG. 1E is a schematic diagram of one embodiment of a selectable degeneration circuit 108. The degeneration circuit 108 may comprise an adjustable degeneration inductor $L_{DEG}$, such as a multiport integrated circuit inductor coil. An adjustable degeneration inductor $L_{DEG}$ may be used to improve linearity in low gain modes. For example, a smaller value for the degeneration inductor $L_{DEG}$ may be used in higher gain modes, and a larger value for the degeneration inductor $L_{DEG}$ may be used in lower gain modes. Some embodiments of the degeneration circuit 108 may include a bypass switch $Sw_{BP}$ coupled in parallel with the degeneration inductor $L_{DEG}$. Accordingly, the degeneration circuit 108 of FIG. 1E allows modes of operation, selected by suitable control circuitry (not shown), where no inductor is present or where a fixed or variable amount of inductance is present.

Performance Examples

Figure 2A:
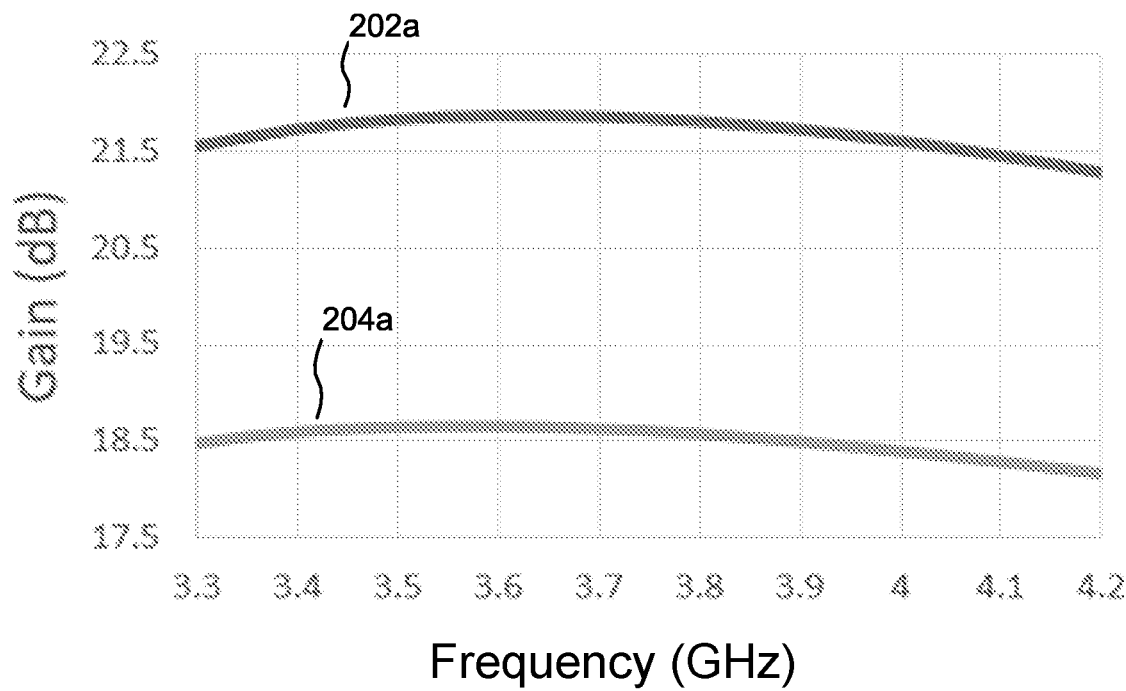
FIG. 2A is a graph comparing gain as a function of frequency for a modeled implementation of the LNA circuit shown in FIG. 1A.

FIG. 2A is a graph comparing gain as a function of frequency for a modeled implementation of the LNA circuit shown in FIG. 1A. Graph line 202a shows the response for the first or high-gain mode in which the first branch of the THWOIM network 102 is active. Graph line 204a shows the response for the second or high-performance moderate-gain mode in which the second branch of the THWOIM network 102 is active. In this example, the high-gain mode achieves a gain of more than 21 dB over about a 900 MHz bandwidth, while the high-performance moderate-gain mode achieves a gain of about 18.5 dB over nearly the same bandwidth.

Figure 2B:
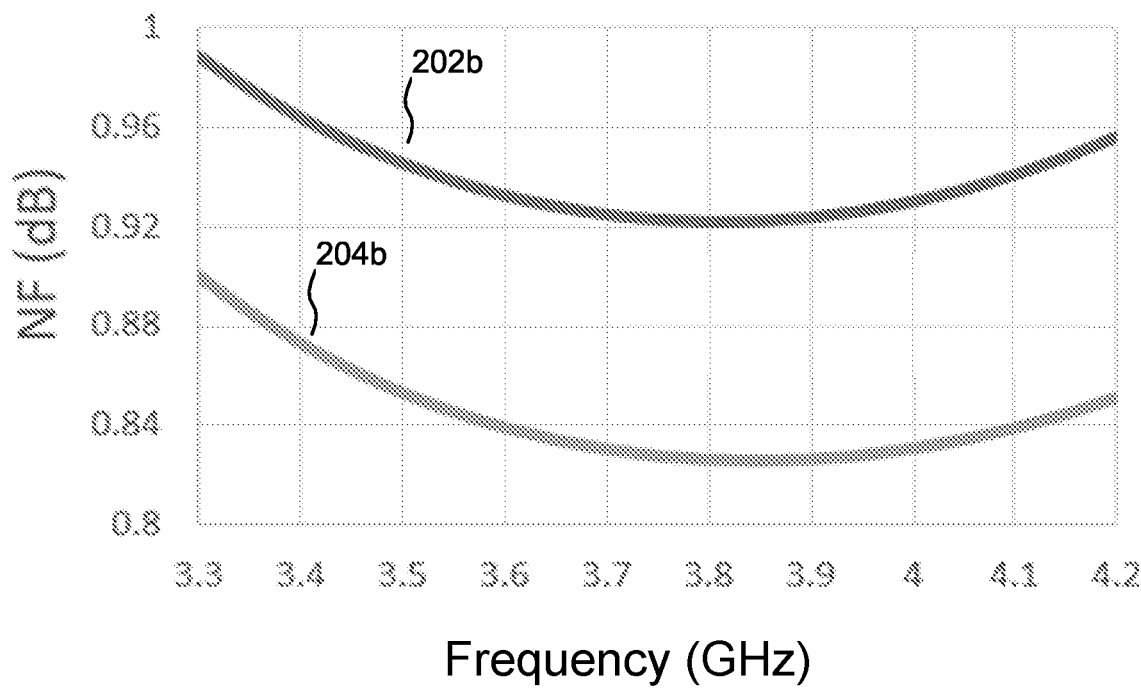
FIG. 2B is a graph comparing NF as a function of frequency for a modeled implementation of the LNA circuit shown in FIG. 1A.

FIG. 2B is a graph comparing NF as a function of frequency for a modeled implementation of the LNA circuit shown in FIG. 1A. Graph line 202b shows the response for the high-gain mode and graph line 204b shows the response for the high-performance moderate-gain mode. In this example, graph line 204b shows better NF performance for the high-performance moderate-gain mode, but the NF of the high-gain mode (about 0.9 to about 1 dB in the full frequency range) is quite sufficient for many applications.

Figure 2C:
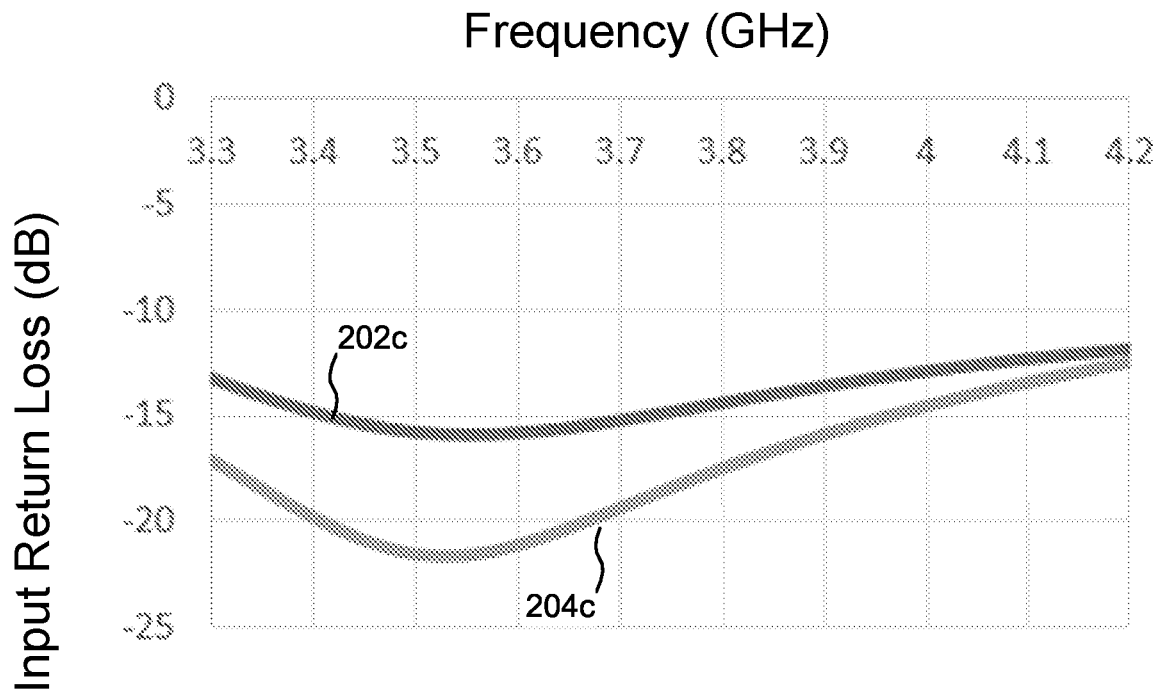
FIG. 2C is a graph comparing input return loss as a function of frequency for a modeled implementation of the LNA circuit shown in FIG. 1A.

FIG. 2C is a graph comparing input return loss as a function of frequency for a modeled implementation of the LNA circuit shown in FIG. 1A. Graph line 202c shows the response for the high-gain mode and graph line 204c shows the response for the high-performance moderate-gain mode. In this example, graph line 204c shows better input return loss performance for the high-performance moderate-gain mode, but the input return loss performance of the high-gain mode is quite sufficient for many applications.

Figure 2D:
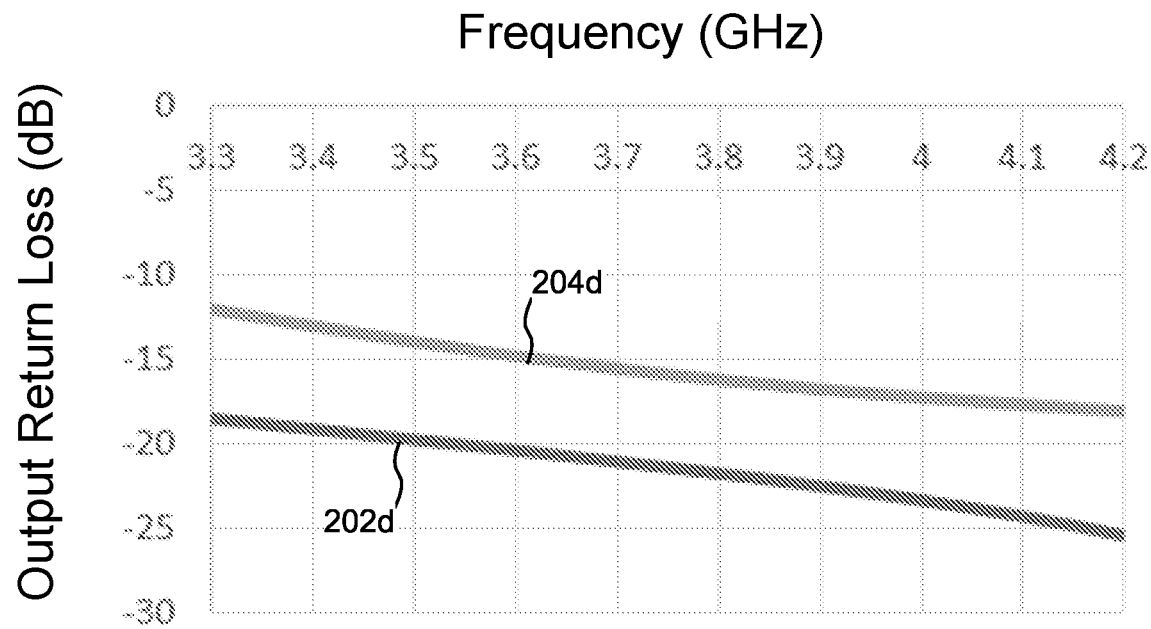
FIG. 2D is a graph comparing output return loss as a function of frequency for a modeled implementation of the LNA circuit shown in FIG. 1A.

FIG. 2D is a graph comparing output return loss as a function of frequency for a modeled implementation of the LNA circuit shown in FIG. 1A. Graph line 202d shows the response for the high-gain mode and graph line 204d shows the response for the high-performance moderate-gain mode. In this example, graph line 202d shows better output return loss performance for the high-gain mode, but the output return loss performance of the high-performance moderate-gain mode is quite sufficient for many applications.

Note that for all of the graphs in FIGS. 2A-D2, the input current $I_{DD}$ applied to the modeled LNA 100 was set at 7.5 mA for the high-performance moderate-gain mode compared to 10 mA for the high-gain mode. In other embodiments, $I_{DD}$ may be optimized for performance tradeoffs.

Second Embodiment

Figure 3:
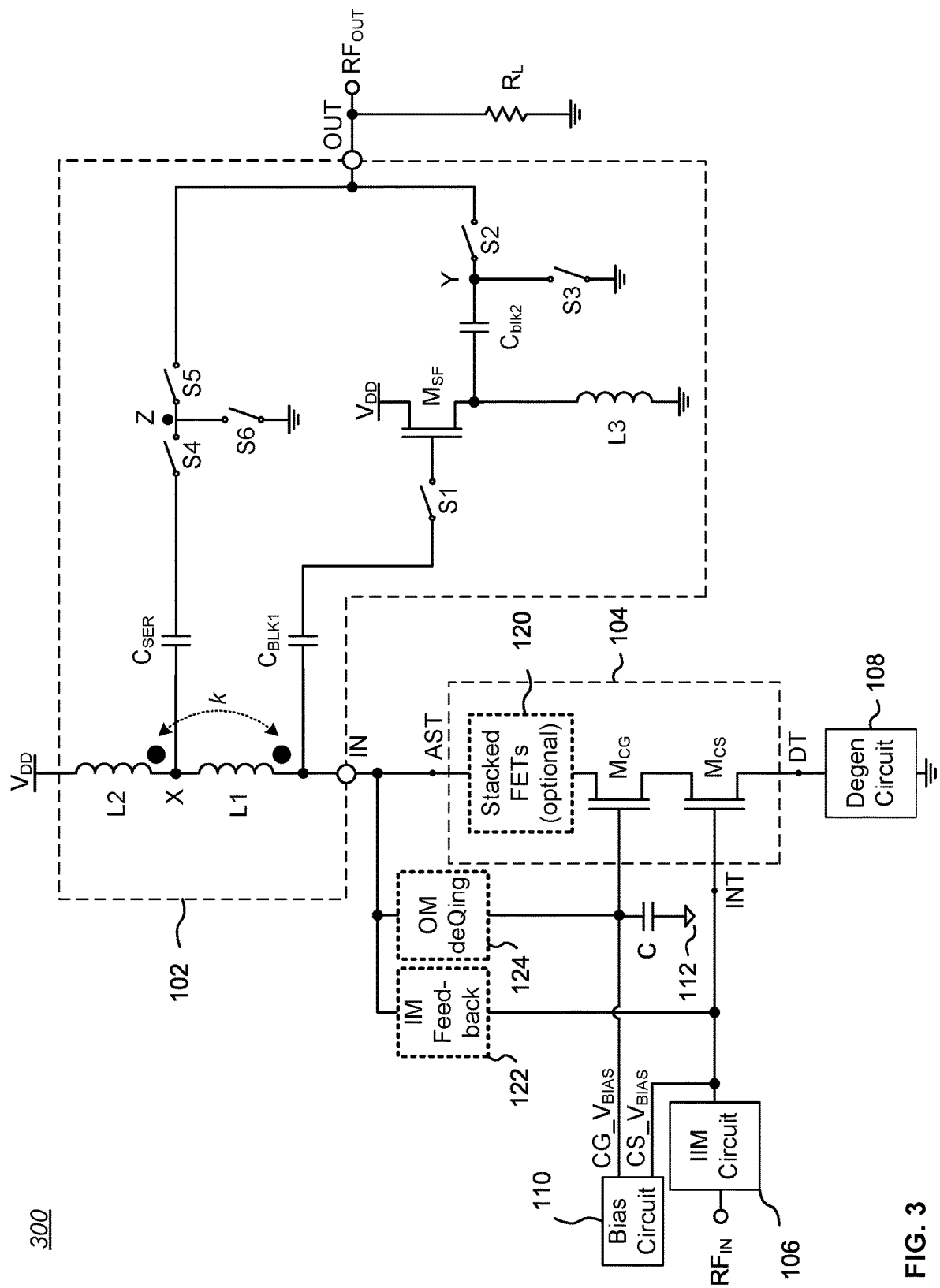
FIG. 3 is a simplified schematic diagram of a second embodiment of a low-noise amplifier circuit having a tunable hybrid wideband output impedance matching network.

FIG. 3 is a simplified schematic diagram of a second embodiment of a low-noise amplifier circuit 300 having a tunable hybrid wideband output impedance matching network 102. Similar in most aspects to the embodiment shown in FIG. 1A, the LNA circuit 300 implements inductors L1 and L2 as an asymmetric T-coil, indicated by the dots adjacent L1 and L2 joined by a dotted arrow k. An asymmetric T-coil is an inductive peaking circuit that can extend an amplifier's bandwidth and speed up the output signal rise-time. As is known, an asymmetric T-coil includes series-coupled inductors (equivalent to the discrete inductors L1 and L2) and an inherent bridging capacitance (not shown) across the inductors. Since a T-coil inherently includes a bridging capacitance, the value of the capacitor $C_{SER}$ may need to be adjusted compared to the value of $C_{SER}$ in the LNA circuit 100 of FIG. 1A.

Integrated circuit implementation of the asymmetric T-coil may be in the form of a three-tap spiral inductor structure, in which a first portion of the spiral (e.g., from an input tap to a mid-tap) corresponds to L1, and a second portion of the spiral (e.g., from the mid-tap to an output tap) corresponds to L2.

An advantage in using an asymmetric T-coil in lieu of discrete inductors L1 and L2 is that IC implementation (e.g., as a three-tap spiral inductor structure) generally saves die area in comparison to discrete inductors. Further, in the high-gain mode, the mutual inductance of the asymmetric T-coil inductances L1 and L2 also contributes to the overall inductance for the load to the amplifier core 104, hence the asymmetric T-coil does not hurt the load inductor Q and gain of the high-gain mode.

Third Embodiment

Figure 4:
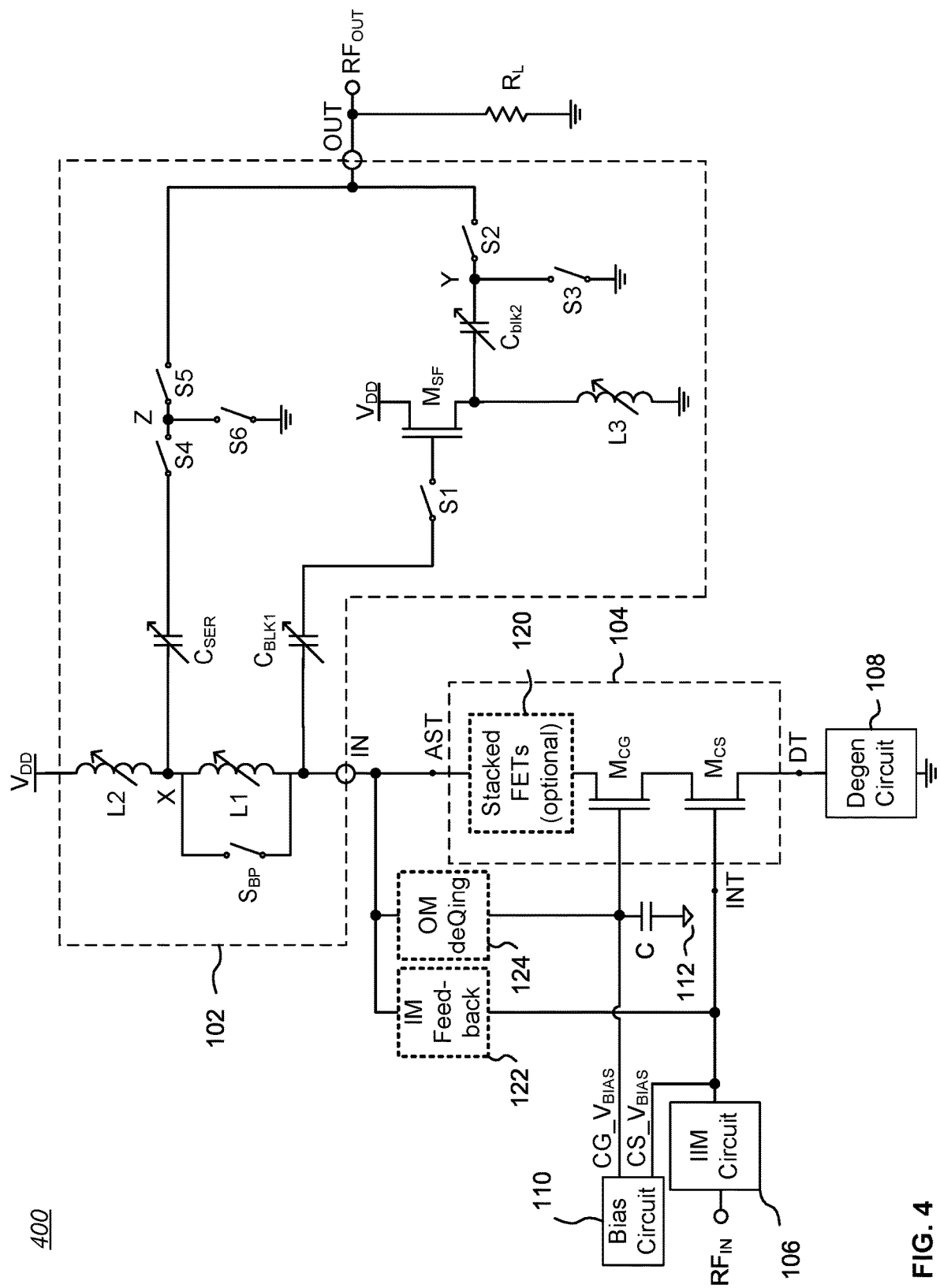
FIG. 4 is a simplified schematic diagram of a third embodiment of a low-noise amplifier circuit having a tunable hybrid wideband output impedance matching network.

The embodiments of FIGS. 1A and 3 may benefit from providing adjustable circuit elements for operation in a number of different modes that allow tradeoffs between gain, bandwidth, and linearity. For example, FIG. 4 is a simplified schematic diagram of a third embodiment of a low-noise amplifier circuit 400 having a tunable hybrid wideband output impedance matching network 102. Similar in most aspects to the embodiment shown in FIG. 1A, the LNA circuit 400 may implement any or all of the inductors L1, L2, and/or L3 as adjustable inductors, and may implement any or all of the capacitors $C_{BLK1}$, $C_{BLK2}$, and/or $C_{SER}$ as adjustable capacitors. In addition, as noted above, any or all of the inductors, resistors, and/or capacitors in the IIM circuit 106, the degeneration circuit 108, the IM feedback circuit 122, and/or the OM deQing circuit 124 may be adjustable. The asymmetric T-coil embodiment of FIG. 3 may be similarly enhanced with adjustable circuit elements.

In addition to making some or all of the inductors, resistors, and/or capacitors within the LNA circuit 400 adjustable to achieve different modes of operation, multiple modes of operation may be achieved by selectively opening and closing various switches (including within the degeneration circuit 108, the IM feedback circuit 122, and/or the OM deQing circuit 124) as desired, thus further enabling tradeoffs among gain, bandwidth, and linearity. In addition, multiple modes of operation may be achieved by adding switches, such as a bypass switch $S_{BP}$ coupled in parallel with inductor L1, to include or exclude circuit elements in one or more modes. Such additional modes may be based on both basic modes of operation (high-performance, moderate-gain mode and high-gain mode) for overall better performance in all such modes.

As should now be appreciated, embodiments of the present invention provide for wideband input and output impedance matching for a wide bandwidth in all modes with no band-switching. Further, the benefits of the present invention may be realized in a single LNA fabricated as an integrated circuit with very little added die area compared to conventional LNA designs.

Circuit Embodiments

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 5:
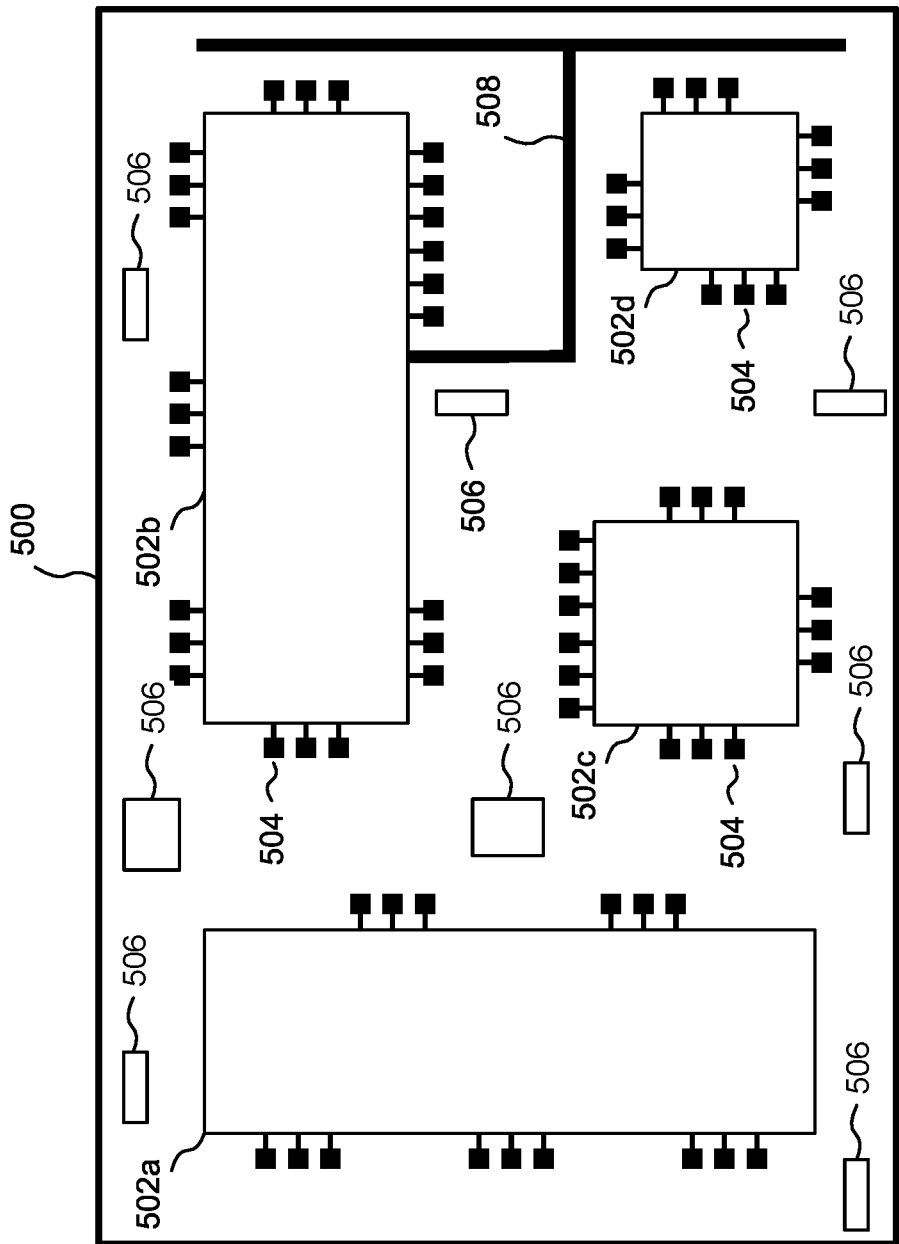
FIG. 5 is a top plan view of a substrate that may be, for example, a printed circuit board or chip module substrate (e.g., a thin-film tile).

As one example of further integration of embodiments of the present invention with other components, FIG. 5 is a top plan view of a substrate 500 that may be, for example, a printed circuit board or chip module substrate (e.g., a thin-film tile). In the illustrated example, the substrate 500 includes multiple ICs 502a-502d having terminal pads 504 which would be interconnected by conductive vias and/or traces on and/or within the substrate 500 or on the opposite (back) surface of the substrate 500 (to avoid clutter, the surface conductive traces are not shown and not all terminal pads are labelled). The ICs 502a-502d may embody, for example, signal switches, active filters, amplifiers (including one or more LNAs), and other circuitry. For example, IC 502b may incorporate one or more instances of an LNA circuit like the circuits shown in FIGS. 1A, 3, and 4.

The substrate 500 may also include one or more passive devices 506 embedded in, formed on, and/or affixed to the substrate 500. While shown as generic rectangles, the passive devices 506 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 500 to other passive devices 506 and/or the individual ICs 502a-502d.

The front or back surface of the substrate 500 may be used as a location for the formation of other structures. For example, one or more antennae may be formed on or affixed to the front or back surface of the substrate 500; one example of a front-surface antenna 508 is shown, coupled to an IC die 502b, which may include RF front-end circuitry. Thus, by including one or more antennae on the substrate 500, a complete radio may be created.

System Aspects

Embodiments of the present invention are useful in a wide variety of larger radio frequency (RF) circuits and systems, such as radio systems (particularly including cellular radio systems), personal computers, tablet computers, wireless network components, televisions, cable system "set top" boxes, radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 6:
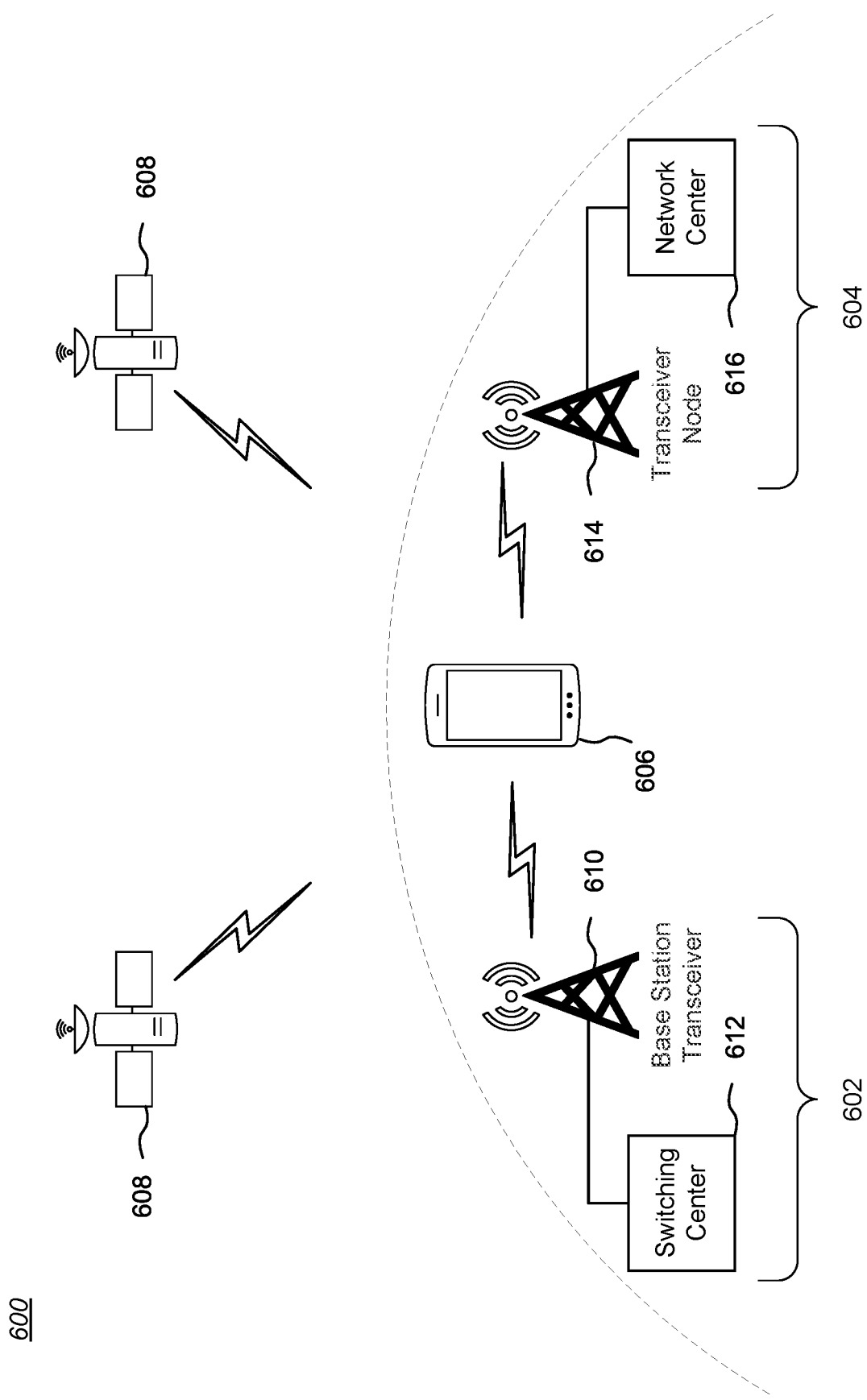
FIG. 6 illustrates an exemplary prior art wireless communication environment comprising different wireless communication systems, and may include one or more mobile wireless devices.

As an example of wireless RF system usage, FIG. 6 illustrates an exemplary prior art wireless communication environment 600 comprising different wireless communication systems 602 and 604, and may include one or more mobile wireless devices 606.

A wireless device 606 may be capable of communicating with multiple wireless communication systems 602, 604 using one or more of the telecommunication protocols noted above. A wireless device 606 also may be capable of communicating with one or more satellites 608, such as navigation satellites (e.g., GPS) and/or telecommunication satellites. The wireless device 606 may be equipped with multiple antennas, externally and/or internally, for operation on different frequencies and/or to provide diversity against deleterious path effects such as fading and multipath interference. A wireless device 606 may be a cellular phone, a personal digital assistant (PDA), a wireless-enabled computer or tablet, or some other wireless communication unit or device. A wireless device 606 may also be referred to as a mobile station, user equipment, an access terminal, or some other terminology.

The wireless system 602 may be, for example, a CDMA-based system that includes one or more base station transceivers (BSTs) 610 and at least one switching center (SC) 612. Each BST 610 provides over-the-air RF communication for wireless devices 606 within its coverage area. The SC 612 couples to one or more BSTs in the wireless system 602 and provides coordination and control for those BSTs.

The wireless system 604 may be, for example, a TDMA-based system that includes one or more transceiver nodes 614 and a network center (NC) 616. Each transceiver node 614 provides over-the-air RF communication for wireless devices 606 within its coverage area. The NC 616 couples to one or more transceiver nodes 614 in the wireless system 604 and provides coordination and control for those transceiver nodes 614.

In general, each BST 610 and transceiver node 614 is a fixed station that provides communication coverage for wireless devices 606, and may also be referred to as base stations or some other terminology. The SC 612 and the NC 616 are network entities that provide coordination and control for the base stations and may also be referred to by other terminologies.

Figure 7:
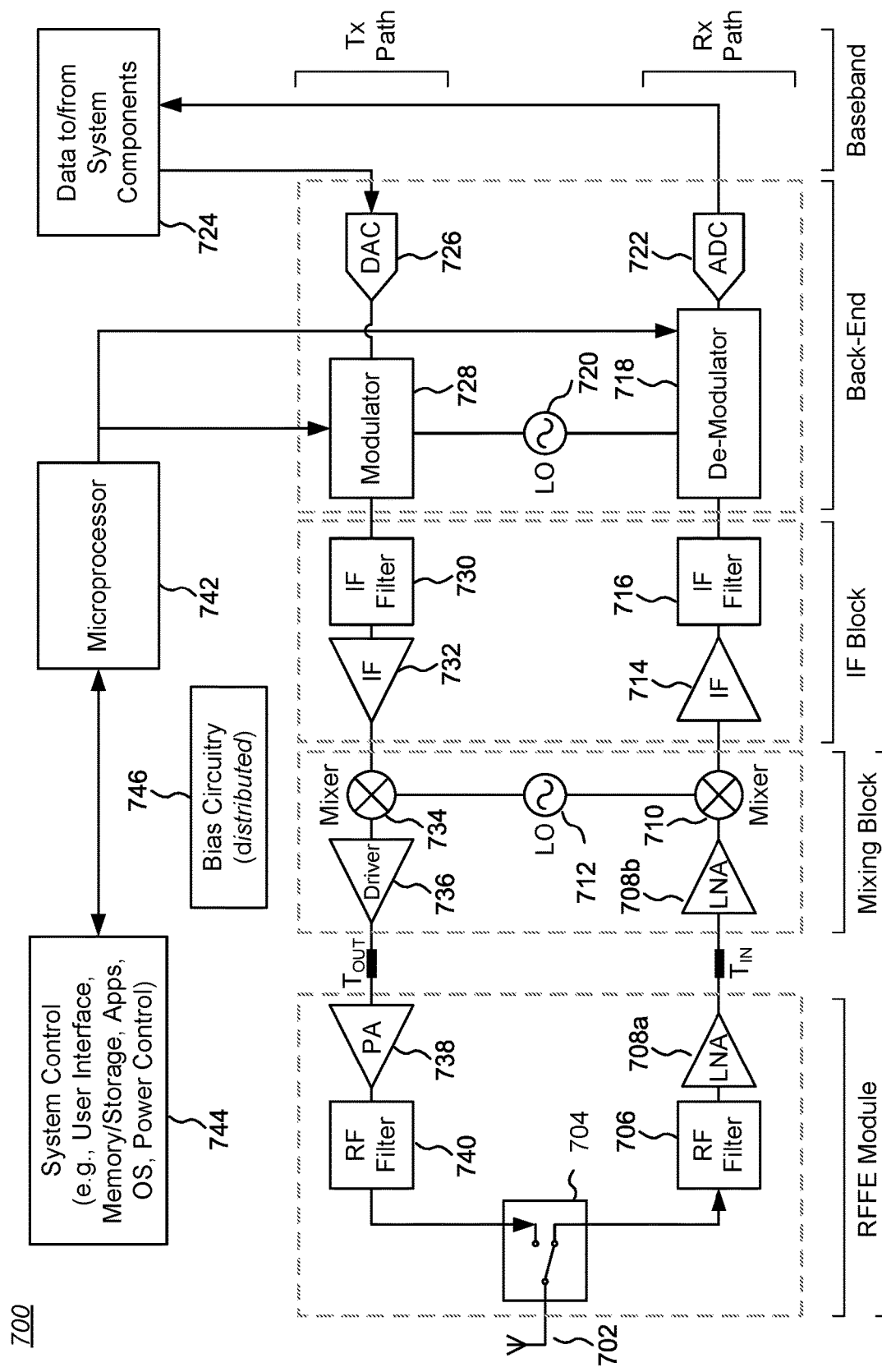
FIG. 7 is a block diagram of a transceiver that might be used in a wireless device, such as a cellular telephone, and which may beneficially incorporate an embodiment of the present invention for improved performance.

An important aspect of any wireless system is in the details of how the component elements of the system perform. FIG. 7 is a block diagram of a transceiver 700 that might be used in a wireless device, such as a cellular telephone, and which may beneficially incorporate an embodiment of the present invention for improved performance. As illustrated, the transceiver 700 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, Intermediate Frequency (IF) Block, Back-End, and Baseband sections (noting that in some implementations, the differentiation between sections may be different). The various illustrated sections and circuit elements may be embodied in one die or multiple IC dies. For example, the RF Front End in the illustrated example may include an RFFE module and a Mixing Block, which may be embodied in (or as part of) different IC dies or modules. The different dies and/or modules may be coupled by transmission lines $T_{IN}$ and $T_{OUT}$ (e.g., microstrips, co-planar waveguides, or an equivalent structure or circuit), either or both of which may have, for example, a 50Ω impedance.

The receiver path Rx receives over-the-air RF signals through at least one antenna 702 and a switching unit 704, which may be implemented with active switching devices (e.g., field effect transistors or FETs) and/or with passive devices that implement frequency-domain multiplexing, such as a diplexer or duplexer. An RF filter 706 passes desired received RF signals to at least one low noise amplifier (LNA) 708a, the output of which is coupled from the RFFE Module to at least one LNA 708b in the Mixing Block (through transmission line $T_{IN}$ in this example). The LNA(s) 708b may provide buffering, input matching, and reverse isolation. The output of the LNA(s) 708b is combined in a corresponding mixer 710 with the output of a first local oscillator 712 to produce an IF signal. The IF signal may be amplified by an IF amplifier 714 and subjected to an IF filter 716 before being applied to a demodulator 718, which may be coupled to a second local oscillator 720. The demodulated output of the demodulator 718 is transformed to a digital signal by an analog-to-digital converter 722 and provided to one or more system components 724 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 724 is transformed to an analog signal by a digital-to-analog converter 726, the output of which is applied to a modulator 728, which also may be coupled to the second local oscillator 720. The modulated output of the modulator 728 may be subjected to an IF filter 730 before being amplified by an IF amplifier 732. The output of the IF amplifier 732 is then combined in a mixer 734 with the output of the first local oscillator 712 to produce an RF signal. The RF signal may be amplified by a driver 736, the output of which is coupled to a power amplifier (PA) 738 (through transmission line $T_{OUT}$ in this example). The amplified RF signal may be coupled to an RF filter 740, the output of which is coupled to at least one antenna 702 through the switching unit 704.

The operation of the transceiver 700 is controlled by a microprocessor 742 in known fashion, which interacts with system control components 744 (e.g., user interfaces, memory/storage devices, application programs, operating system software, power control, etc.). In addition, the transceiver 700 will generally include other circuitry, such as bias circuitry 746 (which may be distributed throughout the transceiver 700 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 700 may be positioned in a different order (e.g., filters) or omitted. Other components can be (and often are) added, such as (by way of example only) additional filters, impedance matching networks, variable phase shifters/attenuators, power dividers, etc.

As a person of ordinary skill in the art will understand, an RF system architecture is beneficially impacted by the current invention in critical ways, including enabling selection of a first mode of operation providing high gain with wide output impedance matching with trade-offs with respect to current, NF, and linearity, and a second mode of operation providing wideband output impedance matching with improved NF and linearity at lower current and moderate gain. These system-level improvements are specifically enabled by the current invention and enable embodiments of the invention to meet the strict performance specifications of customers and a number of RF standards. The current invention is therefore critical to embodiments of the overall system shown in FIG. 7.

Methods

Figure 8:
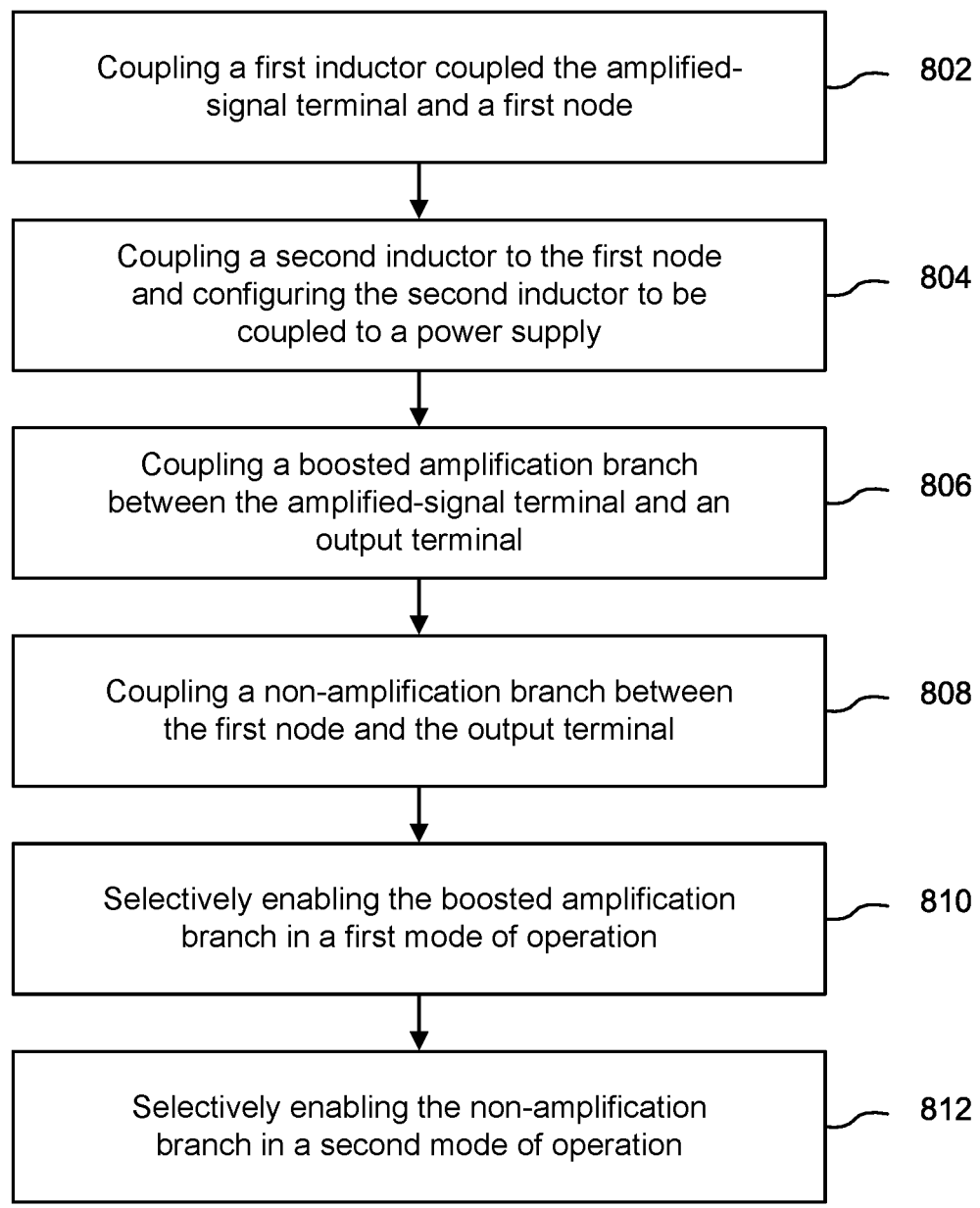
FIG. 8 is a process flow chart showing one method of achieving different gain modes for a radio frequency amplifier having an amplifier core with an amplified-signal terminal.

FIG. 8 is a process flow chart 800 showing one method of achieving different gain modes for a radio frequency amplifier having an amplifier core with an amplified-signal terminal. The method includes: coupling a first inductor coupled the amplified-signal terminal and a first node (BLOCK 802); coupling a second inductor to the first node and configuring the second inductor to be coupled to a power supply (BLOCK 804); coupling a boosted amplification branch between the amplified-signal terminal and an output terminal (BLOCK 806); coupling a non-amplification branch between the first node and the output terminal (BLOCK 808); selectively enabling the boosted amplification branch in a first mode of operation (BLOCK 810); and selectively enabling the non-amplification branch in a second mode of operation (BLOCK 812).

Additional aspects of the above method may include modifying the circuit components implementing the method as described above and shown in FIGS. 1A, 3, and 4.

Fabrication Technologies & Options

While the example embodiments shown in FIGS. 1A, 3, and 4 are LNAs, the inventive circuits and methods may also be applied to other types of amplifiers, such as power amplifiers.

Additional well-known circuit elements that might be included in some applications, such as DC block capacitors, additional impedance matching circuitry, and additional filters, are omitted for clarity. Note also that a circuit component that is characterized as "adjustable" may have its value selected from a number of possible component value settings and fixed during fabrication, when assembled in a circuit module, during factory testing, or in the field (e.g., by burning or "blowing" fusible links), or may have its value be dynamically varied, tuned, or programmatically set, such as in response to other circuitry (e.g., temperature compensation and/or power control circuitry) or in response to generated or received command signals.

The modes of operation of the inventive LNA circuits may be set by a control circuit (not shown) in known fashion. The control circuit may also connect to the components that are adjustable to select different component values (e.g., capacitance, resistance, inductance) for different gain states, for example, to help input and/or output impedance matching or vary gain versus linearity and/or NF in some modes of operation.

The switches shown in embodiments of the present invention may be implemented as FETs, particularly MOSFETs. The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "lower", "upper", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS transistor devices, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A tunable hybrid wideband output impedance matching network having an input terminal configured to be coupled to an amplified-signal terminal of an amplification core, and an output terminal configured to be coupled to a radio-frequency (RF) output terminal, the tunable hybrid wideband output impedance matching network including:
   (a) a first inductor coupled between the input terminal and a first node;
   (b) a second inductor coupled to the first node and configured to be coupled to a power supply;
   (c) a boosted amplification branch connected between the input terminal and the output terminal; and
   (d) a non-amplification branch connected between the first node and the output terminal;
   wherein the boosted amplification branch is enabled in a first mode of operation, and the non-amplification branch is enabled in a second mode of operation, and wherein the first node is not directly connected to the input terminal.

2. The tunable hybrid wideband output impedance matching network of claim 1, wherein the boosted amplification branch includes:
   (a) a first blocking capacitor coupled to the input terminal;
   (b) a third inductor configured to be coupled to a reference voltage;
   (c) a FET having a control gate, a source coupled to the third inductor, and a drain configured to be coupled to the power supply;
   (d) a first switch coupled between the first blocking capacitor and the control gate of the FET;
   (e) a second blocking capacitor coupled between the source of the FET and a second node;
   (f) a second switch coupled between the second node and the output terminal; and
   (g) third switch coupled to the second node and configured to be coupled to the reference voltage.

3. The tunable hybrid wideband output impedance matching network of claim 1, wherein the non-amplification branch includes:
   (a) a first blocking capacitor coupled to the first node;
   (b) a first switch coupled between the first blocking capacitor and a second node;
   (c) a second switch coupled between the second node and the output terminal; and
   (d) a third switch coupled to the second node and configured to be coupled to the reference voltage.

4. The tunable hybrid wideband output impedance matching network of claim 1, wherein the first and second inductors are implemented as an asymmetric T-coil.

5. The tunable hybrid wideband output impedance matching network of claim 1, wherein at least one of the first and second inductors is adjustable.

6. The tunable hybrid wideband output impedance matching network of claim 1, wherein at least one of the first and second inductors is dynamically variable.

7. A tunable hybrid wideband output impedance matching network having an input terminal configured to be coupled to the amplified-signal terminal of an amplification core, and an output terminal configured to be coupled to a radio-frequency (RF) output terminal, the tunable hybrid wideband output impedance matching network including:
   (a) a first inductor coupled between the input terminal and a first node;
   (b) a second inductor coupled to the first node and configured to be coupled to a power supply;
   (c) a first branch coupled between the input terminal and the output terminal, the first branch including:
      (1) a first blocking capacitor coupled to the input terminal;
      (2) a third inductor configured to be coupled to a reference voltage;

(3) a FET having a control gate, a source coupled to the third inductor, and a drain configured to be coupled to the power supply;
(4) a first switch coupled between the first blocking capacitor and the control gate of the FET;
(5) a second blocking capacitor coupled between the source of the FET and a second node;
(6) a second switch coupled between the second node and the output terminal; and
(7) a third switch coupled to the second node and configured to be coupled to the reference voltage; and
(d) a second branch coupled between the first node and the output terminal, the second branch including:
(1) a third blocking capacitor coupled to the first node;
(2) a fourth switch coupled between the third blocking capacitor and a third node;
(3) a fifth switch coupled between the third node and the output terminal; and
(4) a sixth switch coupled to the third node and configured to be coupled to the reference voltage;
wherein the first branch is enabled in a first mode of operation, and the second branch is enabled in a second mode of operation.

8. The tunable hybrid wideband output impedance matching network of claim 7, wherein the first and second inductors are implemented as an asymmetric T-coil.

9. The tunable hybrid wideband output impedance matching network of claim 7, wherein at least one of the first and/or second inductors is adjustable.

10. The tunable hybrid wideband output impedance matching network of claim 7, wherein at least one of the first and/or second inductors is dynamically variable.

11. The tunable hybrid wideband output impedance matching network of claim 7, wherein at least one of the third inductor, the first blocking capacitor, the second blocking capacitor, and/or the third blocking capacitor is adjustable.

12. The tunable hybrid wideband output impedance matching network of claim 7, wherein at least one of the third inductor, the first blocking capacitor, the second blocking capacitor, and/or the third blocking capacitor is dynamically variable.

13. A method of achieving different gain modes for a radio frequency amplifier having an amplifier core with an amplified-signal terminal, the method including:
(a) coupling a first inductor between the amplified-signal terminal and a first node, wherein the first node is not directly connected to the amplified-signal terminal;
(b) coupling a second inductor to the first node and configuring the second inductor to be coupled to a power supply;
(c) coupling a boosted amplification branch between the amplified-signal terminal and an output terminal;
(d) coupling a non-amplification branch between the first node and the output terminal;
(e) selectively enabling the boosted amplification branch in a first mode of operation; and
(f) selectively enabling the non-amplification branch in a second mode of operation.

14. A tunable hybrid wideband output impedance matching network having an input terminal and an output terminal, the tunable hybrid wideband output impedance matching network including:
(a) a first inductor coupled between the input terminal and a first node;
(b) a second inductor coupled to the first node;
(c) a first branch coupled between the input terminal and the output terminal, the first branch including:
(1) a first blocking capacitor coupled to the input terminal;
(2) a FET having a control gate, a source coupled to a third inductor, and a drain;
(3) a first switch coupled between the first blocking capacitor and the control gate of the FET;
(4) a second blocking capacitor coupled between the source of the FET and a second node;
(5) a second switch coupled between the second node and the output terminal; and
(6) a third switch coupled to the second node; and
(d) a second branch coupled between the first node and the output terminal, the second branch including:
(1) a third blocking capacitor coupled to the first node;
(2) a fourth switch coupled between the third blocking capacitor and a third node;
(3) a fifth switch coupled between the third node and the output terminal; and
(4) a sixth switch coupled to the third node;
wherein the first branch is enabled in a first mode of operation, and the second branch is enabled in a second mode of operation.

15. The tunable hybrid wideband output impedance matching network of claim 14, wherein the first and second inductors are implemented as an asymmetric T-coil.

16. The tunable hybrid wideband output impedance matching network of claim 14, wherein at least one of the first and/or second inductors is adjustable.

17. The tunable hybrid wideband output impedance matching network of claim 14, wherein at least one of the first and/or second inductors is dynamically variable.

18. The tunable hybrid wideband output impedance matching network of claim 14, wherein at least one of the third inductor, the first blocking capacitor, the second blocking capacitor, and/or the third blocking capacitor is adjustable.

19. The tunable hybrid wideband output impedance matching network of claim 14, wherein at least one of the third inductor, the first blocking capacitor, the second blocking capacitor, and/or the third blocking capacitor is dynamically variable.

* * * * *